(12) United States Patent
Yang et al.

(10) Patent No.: US 11,699,603 B2
(45) Date of Patent: Jul. 11, 2023

(54) THERMAL PROCESSING SYSTEM WITH TEMPERATURE NON-UNIFORMITY CONTROL

(71) Applicants: Mattson Technology, Inc., Fremont, CA (US); Beijing E-Town Semiconductor Technology, Co., LTD, Beijing (CN)

(72) Inventors: Michael X. Yang, Palo Alto, CA (US); Chen-an Chen, San Jose, CA (US)

(73) Assignees: BEIJING E-TOWN SEMICONDUCTOR TECHNOLOGY, CO., LTD, Beijing (CN); MATTSON TECHNOLOGY, INC., Fremont, CA (US)

(*) Notice: Subject to any disclaimer, the term of this patent is extended or adjusted under 35 U.S.C. 154(b) by 492 days.

(21) Appl. No.: 16/812,526

(22) Filed: Mar. 9, 2020

(65) Prior Publication Data
US 2020/0294826 A1  Sep. 17, 2020

Related U.S. Application Data

(60) Provisional application No. 62/841,340, filed on May 1, 2019, provisional application No. 62/818,194, filed on Mar. 14, 2019.

(51) Int. Cl.
*H01L 21/677* (2006.01)
*H01L 21/67* (2006.01)
(Continued)

(52) U.S. Cl.
CPC ...... *H01L 21/67115* (2013.01); *B23K 26/034* (2013.01); *B23K 26/066* (2015.10);
(Continued)

(58) Field of Classification Search
CPC ............. B23K 2101/40; B23K 26/034; B23K 26/066; G02F 1/15; G02F 1/157;
(Continued)

(56) References Cited

U.S. PATENT DOCUMENTS 4,194,812 A   3/1980   Hara et al.
4,500,878 A   2/1985   Hareng et al.
(Continued)

FOREIGN PATENT DOCUMENTS

JP    2002-299328    10/2002
JP    2008-041698    2/2008
WO    WO1998028660  7/1998

OTHER PUBLICATIONS

PCT International Search Report and Written Opinion for corresponding PCT Application No. PCT/US2020/021661, dated Jul. 3, 2020, 11 pages.

*Primary Examiner* — Sang Y Paik
(74) *Attorney, Agent, or Firm* — Dority & Manning, P.A.

(57) ABSTRACT

A thermal processing system is provided. The thermal processing system can include a processing chamber and a workpiece disposed within the processing chamber. The thermal processing system can include a heat source configured to emit light towards the workpiece. The thermal processing system can further include a tunable reflective array disposed between the workpiece and the heat source. The tunable reflective array can include a plurality of pixels. Each pixel of the plurality of pixels can include an electrochromatic material configurable in a translucent state or an opaque state. When the electrochromatic material of a pixel is configured in the translucent state, the light at least partially passes through the pixel. Conversely, transmission of light through a pixel is reduced when the electrochromatic material of the pixel is configured in the opaque state.

15 Claims, 8 Drawing Sheets

(51) Int. Cl.
*H01L 21/66* (2006.01)
*H01L 21/268* (2006.01)
*B23K 26/066* (2014.01)
*B23K 26/03* (2006.01)
*G02F 1/157* (2006.01)
*H05B 3/00* (2006.01)
*B23K 101/40* (2006.01)

(52) U.S. Cl.
CPC ............ *G02F 1/157* (2013.01); *H01L 21/268* (2013.01); *H01L 21/67248* (2013.01); *H01L 22/26* (2013.01); *H05B 3/0047* (2013.01); *B23K 2101/40* (2018.08); *H05B 2203/032* (2013.01)

(58) Field of Classification Search
CPC .. G02F 1/163; H01L 21/268; H01L 21/67115; H01L 21/67248; H01L 22/26; H05B 2203/032; H05B 3/0047; H05B 1/0233
USPC .................. 392/404, 407–408, 416–429
See application file for complete search history.

(56) References Cited

U.S. PATENT DOCUMENTS

| | | | |
|---|---|---|---|
| 5,708,755 A * | 1/1998 | Gronet | C30B 31/12 392/416 |
| 6,233,041 B1 | 5/2001 | Shiraishi | |
| 6,267,246 B1 | 7/2001 | Russell et al. | |
| 6,803,546 B1 | 10/2004 | Boas et al. | |
| 7,127,367 B2 | 10/2006 | Ramachandran et al. | |
| 8,283,607 B2 | 10/2012 | Ranish et al. | |
| 2002/0019148 A1 | 2/2002 | Hawryluk et al. | |
| 2002/0020358 A1* | 2/2002 | Hey | C23C 16/4404 118/728 |
| 2004/0018008 A1 | 1/2004 | Koren et al. | |
| 2004/0097063 A1* | 5/2004 | Sakuma | H01L 21/67248 438/616 |
| 2005/0063453 A1* | 3/2005 | Camm | H01L 21/67248 374/161 |
| 2006/0073622 A1* | 4/2006 | Hartzell | B23K 26/0604 438/22 |
| 2015/0371865 A1 | 12/2015 | Chen et al. | |
| 2017/0011975 A1 | 1/2017 | Vukovic et al. | |
| 2019/0198732 A1* | 6/2019 | Shimizu | H01L 33/58 |

* cited by examiner

THERMAL PROCESSING SYSTEM WITH TEMPERATURE NON-UNIFORMITY CONTROL

PRIORITY CLAIM

The present application is based on and claims priority to U.S. Provisional Application No. 62/818,194, titled "Thermal Processing System with Temperature Non-Uniformity Control," having a filing date of Mar. 14, 2019, which is incorporated by reference herein. The present application is also based on and claims priority to U.S. Provisional Application No. 62/841,340, titled "Thermal Processing System with Temperature Non-Uniformity Control," having a filing date of May 1, 2019, which is incorporated by reference herein.

FIELD

The present disclosure relates generally to thermal processing systems.

BACKGROUND

Thermal processing systems can define a processing chamber configured to accommodate a workpiece, such as a semiconductor wafer. Thermal processing systems can further include a heat source (e.g., heat lamp) configured to heat the workpiece. However, non-uniformities in the temperature profile associated with the workpiece can develop as the heat source heats the workpiece, which can lead to anomalies in the workpiece.

SUMMARY

Aspects and advantages of embodiments of the present disclosure will be set forth in part in the following description, or may be learned from the description, or may be learned through practice of the embodiments.

In one aspect, a thermal processing system is provided. The thermal processing system can include a processing chamber and a workpiece disposed within the processing chamber. In addition, the thermal processing system can further include a heat source configured to emit light towards the workpiece. Furthermore, the thermal processing system can include a tunable reflective array disposed between the workpiece and the heat source. The tunable reflective array can include a plurality of pixels. Each pixel of the plurality of pixels can include an electrochromatic material configurable in a translucent state or an opaque state. When the electrochromatic material of a pixel is configured in the translucent state, the light at least partially passes through the pixel. Conversely, transmission of light through a pixel is reduced when the electrochromatic material of the pixel is configured in the opaque state.

In another aspect, a method for controlling operation of a thermal processing system having a heat source and a tunable reflective array positioned between the heat source and a workpiece disposed within a processing chamber of the thermal processing system is provided. The method includes obtaining, by a controller of the thermal processing system, data indicative of a temperature profile associated the workpiece. The method further includes controlling, by the controller, operation of the reflective array based, at least in part, on the data indicative of the temperature profile to reduce non-uniformity in the temperature profile.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
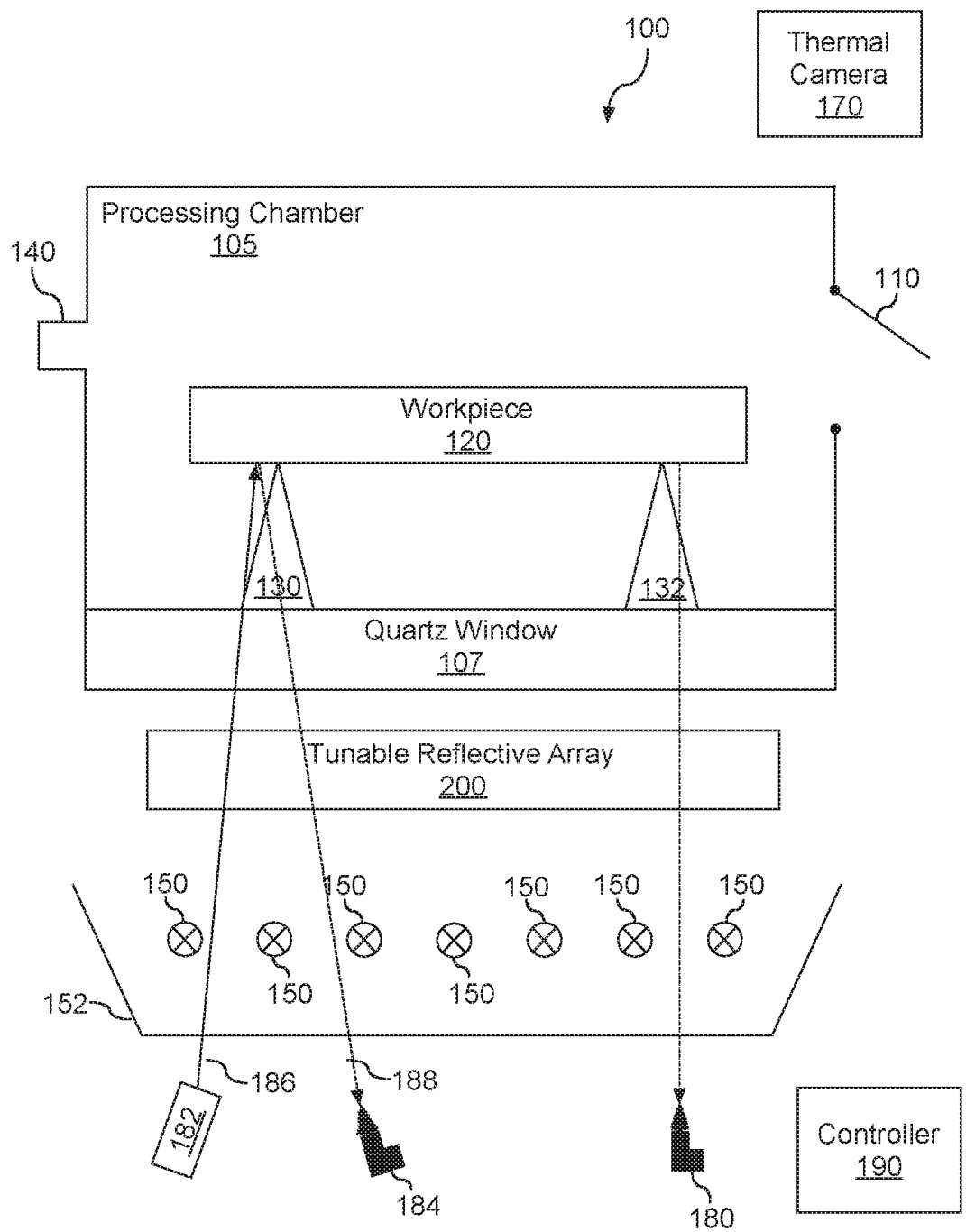
FIG. 1 depicts a thermal processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to thermal processing systems. A thermal processing system according to the present disclosure can define a processing chamber configured to accommodate a workpiece. In some implementations, the workpiece can be a semiconductor wafer. It should be appreciated, however, that the semiconductor wafer can be formed from any suitable type of semiconductor material. Examples of semiconductor material from which the semiconductor wafer is formed can include, without limitation, silicon, germanium, or III-V semiconductor. However, other suitable workpieces can be used without deviating from the scope of the present disclosure.

The thermal processing system can include a heat source (e.g., heat lamp source) disposed outside the processing chamber. The heat source can be configured to heat the workpiece. More specifically, the heat source can be configured to emit light towards the workpiece to raise a temperature of the workpiece. As will be discussed below in more detail, the thermal processing system can be configured to heat the workpiece in a uniform manner to reduce or eliminate anomalies (e.g., warpage) in the workpiece that occur when the workpiece is heated in a non-uniform manner.

The thermal processing system can include one or more sensors configured to obtain data indicative of a temperature profile associated with the workpiece. It should be appreciated that the temperature profile can be indicative of a spatial distribution of temperature across the workpiece. For example, the temperature profile can indicate a first temperature at a first location on the workpiece and can further indicate a second temperature at a second location on the workpiece that is different from the first location.

In some implementations, the one or more sensors can include a thermal camera configured to obtain thermal image data (e.g., infrared image data) indicative of the temperature profile associated with the workpiece. The thermal image data can indicate non-uniformity in the temperature profile associated with the workpiece. For instance, the thermal image data can indicate a portion of the workpiece is warmer relative to the remaining portion of the workpiece. Alternatively, the thermal image data can indicate the portion of the workpiece is colder relative to the remaining portion of the workpiece.

In some implementations, the one or more sensors can include a pyrometer configured to obtain temperature measurements indicative of the temperature profile associated with a surface of the workpiece. The temperature measurements can indicate non-uniformity in the temperature profile associated with the surface of the workpiece. For instance, the temperature measurements can indicate a portion of the surface is warmer relative to the remaining portion of the surface. Alternatively, the temperature measurements can indicate the portion of the workpiece is colder relative to the remaining portion of the workpiece.

In some implementations, the thermal processing system can include a controller communicatively coupled with the one or more sensors (e.g., camera, pyrometer). In this manner, the controller can be configured to obtain the data indicative of the temperature profile associated with the workpiece. As will be discussed below in more detail, the controller can be configured to control operation of a tunable reflective array (e.g., a liquid crystal switchable mirror, liquid crystal array, or other suitable tunable reflective array) to reduce or eliminate non-uniformities in the temperature profile based, at least in part, on the data obtained from the one or more sensors.

The tunable reflective array can be positioned between the heat source and the workpiece. Furthermore, the tunable reflective array can include a plurality of pixels. Each of the plurality of pixels can include electrochromatic material. The electrochromatic material can be configurable in an opaque state and a translucent state. When the electrochromatic material is configured in the opaque state, the pixel can block, absorb, or reflect light emitted from the heat source. Conversely, light emitted from the heat source can at least partially pass through the pixel when the electrochromatic material is configured in the translucent state. In this manner, the controller can be configured to adjust the state (e.g., opaque state, translucent state) of the electrochromatic material of one or more pixels of the tunable reflective array to reduce or eliminate non-uniformity in the temperature profile associated with the workpiece. In some embodiments, the tunable reflective array can be a liquid crystal switchable mirror.

In some implementations, the controller can be configured to adjust the state of the electrochromatic material of one or more pixels while a thermal treatment process is being performed on the workpiece. In this manner, non-uniformity in the temperature profile associated with the workpiece can be reduced or eliminated in situ and in real-time or near real-time. In alternative implementations, the controller can be configured to adjust the state of the electrochromatic material of one or more pixels subsequent to performing the thermal treatment process (e.g., rapid thermal anneal) on the workpiece to improve processing of the next workpiece or later workpieces.

In some embodiments, the heat sources can be an array of linear lamps. The tunable reflective array can include a plurality of pixels having a linear shape have a long dimension that is at least 5 times greater than a short dimension. The plurality of pixels can be arranged such that the long dimension is generally perpendicular to a long dimension associated with each of the linear lamps. As used herein, the term "generally perpendicular" refers to within 15° of perpendicular. In this way, the temperature uniformity of the workpiece can be controlled in two general directions: a first direction associated with the long dimension of the linear lamps and a second direction associated with a long dimension of the pixels.

The thermal processing apparatus according to example aspects of the present disclosure can provide numerous technical benefits. For instance, the electrochromatic material of one or more pixels of the tunable reflective array can be configured in the opaque state or the translucent state to reduce non-uniformity in the temperature profile associated with a workpiece. In this manner, anomalies (e.g., warpage) in the workpiece that are attributable to non-uniformity in the temperature profile can be reduced and process uniformity can be increased.

As used herein, the use of the term "about" in conjunction with a numerical value is intended to refer to within 20% of the stated amount. In addition, the terms "first," "second," and "third" may be used interchangeably to distinguish one component from another and are not intended to signify location or importance of the individual components.

Referring now to the figures, FIG. 1 depicts a thermal processing system 100 according to example embodiments of the present disclosure. As shown, the thermal processing system 100 can include a processing chamber 105. In some implementations, the processing chamber 105 can be defined, at least in part, by a quartz window 107 of the thermal processing system 100. In some implementations, the quartz window 107 can be doped with hydroxide OH. It should be appreciated that the one or more surfaces defining the processing chamber 105 can be formed from any suitable material. For instance, in some implementations, the one or more surfaces defining the processing chamber 105 can be formed from quartz.

As shown, the thermal processing system 100 can include a door 110 movable between an open position (FIG. 1) and a closed position (not shown) to permit selective access to the processing chamber 105. For instance, the door 110 can be moved to the open position to allow a workpiece 120 to be positioned within the processing chamber 105. In some implementations, the workpiece 120 can be supported, at least in part, by support pins 130, 132. In this manner, heat associated with emitting light onto the quartz window 107 can be transferred to the workpiece 120. Furthermore, the door 110 can be moved to the closed position once the workpiece 120 is disposed on the support pins 130, 132. In some implementations, the processing chamber 105 can be sealed off from an external environment when the door 110 is in the closed position.

In some implementations, the one or more surfaces defining the processing chamber 105 can define a gas inlet port 140. In this manner, a process gas provided from a gas source can flow into the processing chamber 105 via the gas inlet port 140. In some implementations, the process gas can include an inert gas that does not react with the workpiece 120. Alternatively, the process gas can include a reactive gas that reacts with workpiece 120 to deposit a layer of material on the surface of the workpiece 120. For instance, in some implementations, the process gas can include hydrogen $H_2$ gas. It should be appreciated, however, that the process gas can include any suitable reactive gas. For instance, in alternative implementations, the reactive gas can include oxygen $O_2$ or ammonia $NH_3$. Alternatively, the process gas can include a mixture of one or more gases. For example, the process gas can include a mixture of hydrogen $H_2$ and oxygen $O_2$.

The thermal processing system 100 can include one or more heat sources 150 disposed outside of the processing chamber 105. The one or more heat sources 150 can be configured to emit light towards the workpiece 120 during a thermal treatment process, such as a rapid thermal treatment. The light emitted from the one or more heat sources 150 can raise a temperature of the workpiece 120. In some implementations, the one or more heat sources 150 can raise the temperature of the workpiece 120 by greater than about 1000° C. within a predetermined amount of time (e.g., seconds).

It should be appreciated that the one or more heat sources 150 can include any suitable type of heat source configured to emit light. For instance, in some implementations, the one or more heat sources 150 can include one or more heat lamps (e.g., linear lamps). In alternative implementations, the one or more heat sources 150 can include one or more laser emitting diodes (LED) or laser beams to illuminate the workpiece 120.

In some implementations, the thermal processing system 100 can include a reflector 152 positioned such that the light emitted from the one or more heat sources 150 is directed to or towards the processing chamber 105. More specifically, the reflector 152 can direct the light emitted from the one or more heat sources 150 to or towards the quartz window 107 such that the light can pass through the quartz window 107 and into the processing chamber 105. It should be appreciated that at leak a portion of the light entering the processing chamber 105 via the quartz window 107 can be emitted onto the workpiece 120. In this manner, the light emitted from the one or more heat sources 150 can, as discussed above, raise the temperature of the workpiece 120 during a thermal treatment process, such as a rapid thermal treatment (e.g., rapid thermal anneal treatment). As will be discussed below in more detail, the thermal processing system 100 can include one or more sensors configured to obtain data indicative of a temperature profile associated with the workpiece 120.

In some implementations, the thermal processing system 100 can include a thermal camera 170 configured to obtain thermal image data (e.g., infrared image data) indicative of a temperature profile associated with the workpiece 120. The thermal image data can indicate non-uniformity in the temperature profile. For instance, the thermal image data can indicate a portion of the workpiece 120 is warmer relative to the remaining portion of the workpiece 120. Alternatively, the thermal image data can indicate the portion of the workpiece 120 is colder relative to the remaining portion of the workpiece 120.

In some implementations, the thermal camera 170 can include a complementary metal-oxide-semiconductor (CMOS) camera. It should be appreciated, however, that the camera can include any suitable type of camera configured to obtain thermal image data indicative of one or more non-uniformities in the temperature profile associated with the workpiece 120. In some implementations, the thermal camera 170 can have a shutter speed of about one thousand frames per second. In alternative implementations, the thermal camera 170 can have a shutter speed of about ten thousand frames per second. It should also be appreciated that a lens of the thermal camera 170 can have any suitable focal length. For instance, in some implementations, the focal length of the lens can be less than about 30 centimeters. In alternative implementations, the focal length of the lens can be less than about 10 centimeters.

In some implementations, the thermal processing system 100 can include a pyrometer 180 configured to obtain data indicative of a temperature profile associated with a surface of the workpiece 120. The data obtained via the pyrometer 180 can include a plurality of temperature measurements. Furthermore, each temperature measurement of the plurality of temperature measurements can be associated with a different location along the surface of the workpiece 120. It should be appreciated that coupled with a wafer rotation, the data obtained via the pyrometer 180, which is stationary, can indicate non-uniformity in the temperature profile associated with the surface of the workpiece 120. For instance, the data can indicate a portion of the surface is warmer relative to the remaining portion of the surface. Alternatively, the temperature measurements can indicate the portion of the workpiece is colder relative to the remaining portion of the workpiece.

In some implementations, the thermal processing system 100 can include a device configured to determine reflectivity of the workpiece 120. As shown, the device can include a transmitter 182 and a receiver 184. The transmitter 182 can be configured to emit a signal 186 that reflects off the workpiece 120. The reflected signal 188 can be received via the receiver 184 of the device. It should be appreciated that a controller 190 of the thermal processing system 100 can be configured to determine reflectivity of the workpiece based, at least in part, on a difference between one or more parameters (e.g., phase, amplitude) of the signal 186 and the reflected signal 188.

In some implementations, the thermal processing system 100 can include a controller 190. As will be discussed below in more detail, the controller 190 can be configured to control operation of a tunable reflective array 200 of the thermal processing system 100 to reduce or eliminate non-uniformity in the temperature profile associated with the workpiece 120. In this manner, the thermal processing system 100 can reduce anomalies (e.g., warpage) in the workpiece 120 that are attributable to non-uniformity in the temperature profile associated with the workpiece 120.

As shown, the tunable reflective array 200 can be disposed between the workpiece 120 and the one or more heat sources 150. More specifically, the tunable reflective array 200 can be disposed between the quartz window 107 and the one or more heat sources 150. In this manner, the tunable reflective array 200 can be positioned outside of the processing chamber 105. The tunable reflective array 200 can include a plurality of pixels. Each pixel of the plurality of pixels can be formed from electrochromic material.

Examples of the electrochromic material can include metal oxides, such as tungsten oxide $WO_3$. It should be appreciated however, that each pixel can be formed from any suitable type of electrochromatic material. For instance, in some embodiments, the tunable reflective array 200 can be a liquid crystal reflective mirror where liquid crystals are aligned to be either reflective or transmissive depending on an electrical signal provided to a portion (e.g., pixel) of the tunable reflective array 200.

In some implementations, the electrochromatic material can be configurable in an opaque state and a translucent state. When the electrochromatic material of a pixel is configured in the opaque state, the pixel can reflect light emitted from the heat source. Conversely, light emitted from the heat source can at least partially pass through the pixel when the electrochromatic material is configured in the translucent state. In this manner, the controller 190 can be configured to adjust the state (e.g., opaque state, translucent state) of the electrochromatic material of one or more pixels of the tunable reflective array 200 to reduce or eliminate non-uniformity in the temperature profile associated with the workpiece 120.

In some implementations, the controller 190 can be configured to adjust the state (e.g., opaque state, translucent state) of the electrochromatic material of one or more pixels of the tunable reflective array 200 while a thermal treatment process is being performed on the workpiece 120. In this manner, non-uniformity in the temperature profile associated with the workpiece 120 can be reduced or eliminated in real-time or near real-time. In alternative implementations, the controller 190 can be configured to adjust the state of the electrochromatic material of the one or more pixels subsequent to performing the thermal treatment process on the workpiece 120. In this manner, non-uniformity in the temperature profile associated with subsequently processed workpieces can be reduced or eliminated.

Figure 2:
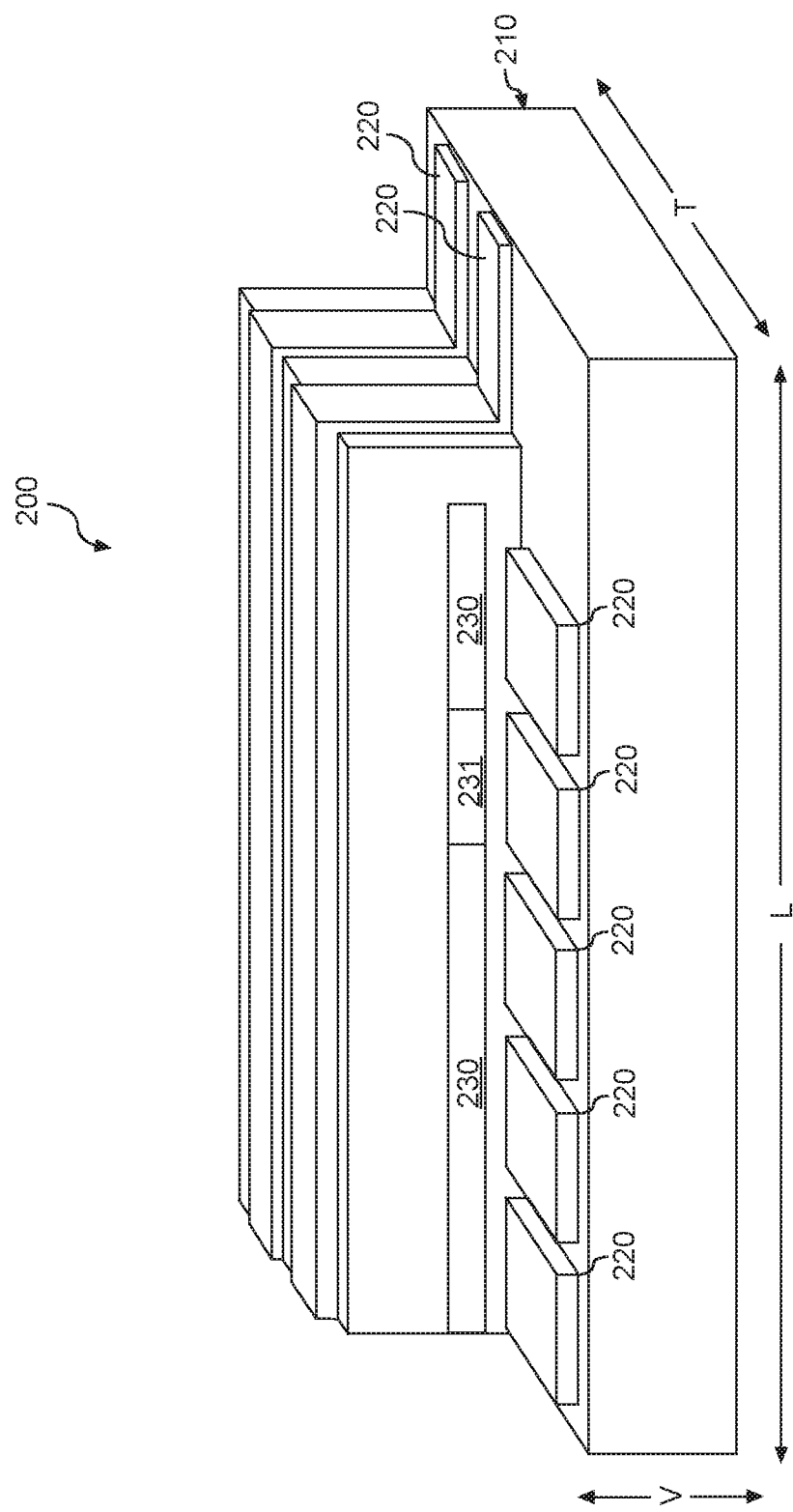
FIG. 2 depicts a tunable reflective array of a thermal processing system according to example embodiments of the present disclosure.

Referring now to FIG. 2, an example embodiment of the tunable reflective array 200 is provided according to the present disclosure. The tunable reflective array 200 can define a coordinate system that includes a lateral direction L, a transverse direction T and a vertical direction V. As shown, the tunable reflective array 200 can include a substrate 210. In some implementations, the substrate 210 can be formed from glass. It should be appreciated, however, that the substrate 210 can be formed from any suitable translucent material.

Figure 8:
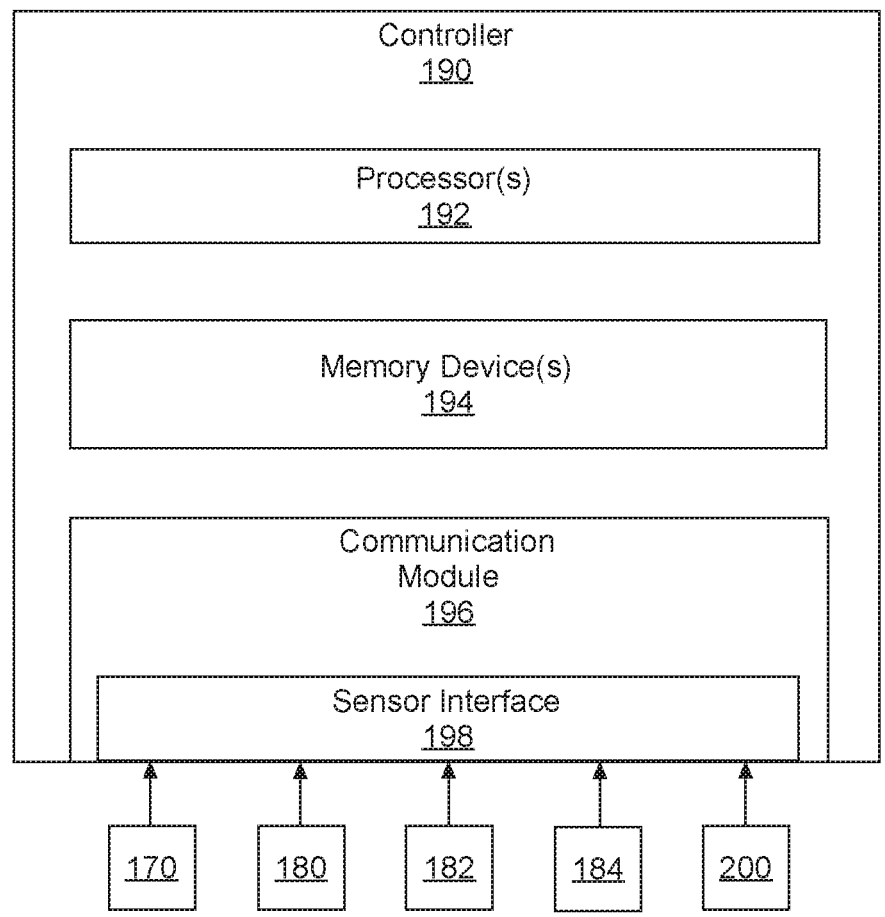
FIG. 8 depicts a block diagram of components of a controller according to example embodiments of the present disclosure.

In some implementations, the tunable reflective array 200 can include a plurality of conductive electrodes 220. Each electrode of the plurality of electrodes 220 can be electrically coupled to the controller 190 (FIG. 8). In this manner, the controller 190 can control a voltage applied to each of the plurality of electrodes 220, In some implementations, the voltage applied to one or more of the plurality of electrodes 220 can affect a state of the electrochromatic material of one or more pixels of a plurality of pixels 230 included in the tunable reflective array 200. For example, a voltage can be applied to one or more of the plurality of electrodes 220 such that the electrochromatic material of at least one pixel 231 of the plurality of pixels 230 is configured in the opaque state (e.g., reflective state). In this manner, the at least one pixel 231 can reflect the light emitted from the one or more heat sources 150 (FIG. 1). In some implementations, the electrochromatic material of the at leak one pixel 231 can return to the translucent state or transparent state when the voltage is no longer applied to the one or more of the plurality of electrodes 220. Alternatively, the controller 190 can be configured to apply a different voltage to the one or more of the plurality of electrodes 220 such that the electrochromatic material of the at least one pixel 231 is configured in the translucent state. It should be appreciated that at least a portion of the light emitted from the one or more heat sources 150 can pass through the at leak one pixel 231 when the electrochromatic material of the at least one pixel 231 is configured in the translucent state or transparent state.

Figure 3:
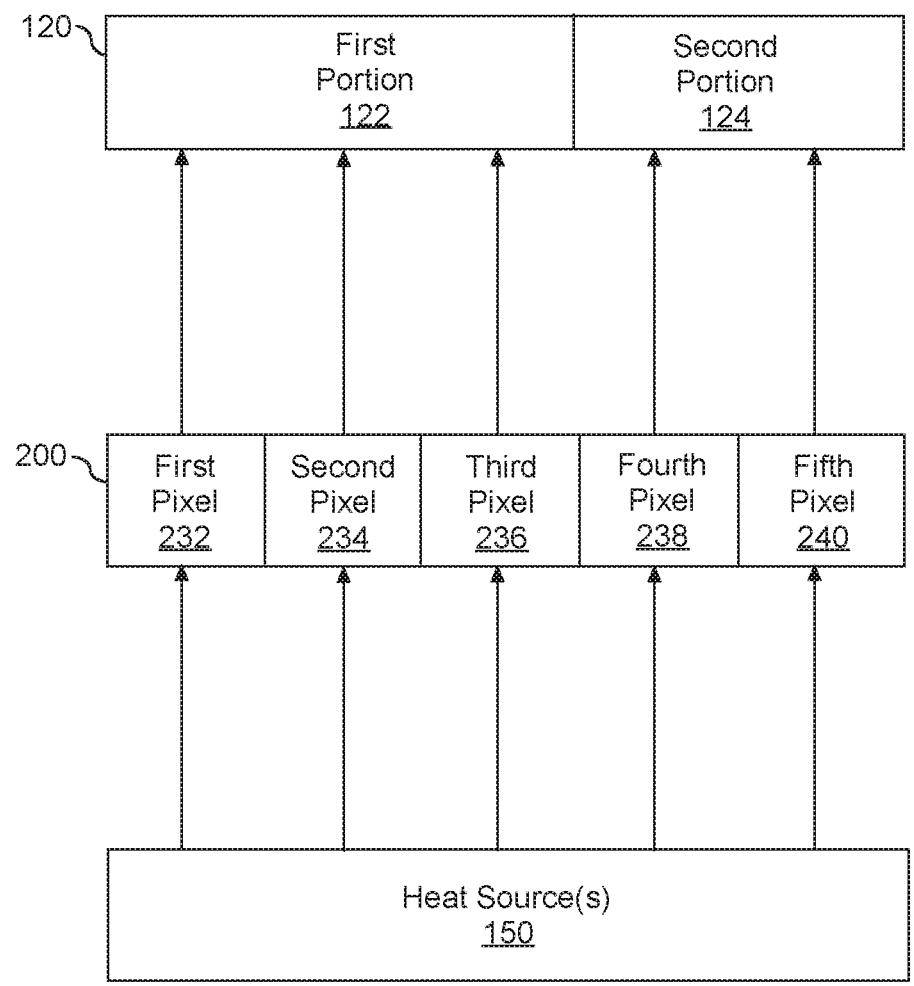
FIG. 3 depicts a plurality of pixels of a tunable reflective array configured in a translucent state according to example embodiments of the present disclosure.

Referring now to FIG. 3, the tunable reflective array 200 can include a first pixel 232, a second pixel 234, a third pixel 236, a fourth pixel 238 and a fifth pixel 240. It should be appreciated, however, that the tunable reflective array 200 can include more or fewer pixels. In some implementations, electrochromatic material of the first pixel 232, second pixel 234, third pixel 236, fourth pixel 238 and fifth pixel 240 can be configured in translucent state. In this manner, light (denoted by arrows) emitted from the one or more heat sources 150 can at least partially pass through the pixels 232, 234, 236, 238, 240 and onto the workpiece 120.

In some implementations, non-uniformity in the temperature profile associated with the workpiece 120 can develop as the one or more heat sources 150 heat the workpiece 120. For example, the one or more heat sources 150 can heat the workpiece 120 such that a temperature associated with a first portion 122 of the workpiece 120 rises faster than a temperature associated with a second portion 124 of the workpiece 120. As will be discussed below in more detail, the electrochromatic material of one or more of the first pixel 232, second pixel 234 and third pixel 236 can be adjusted to the opaque state to reduce the amount of light emitted onto the first portion 122 of the workpiece 120.

Figure 4:
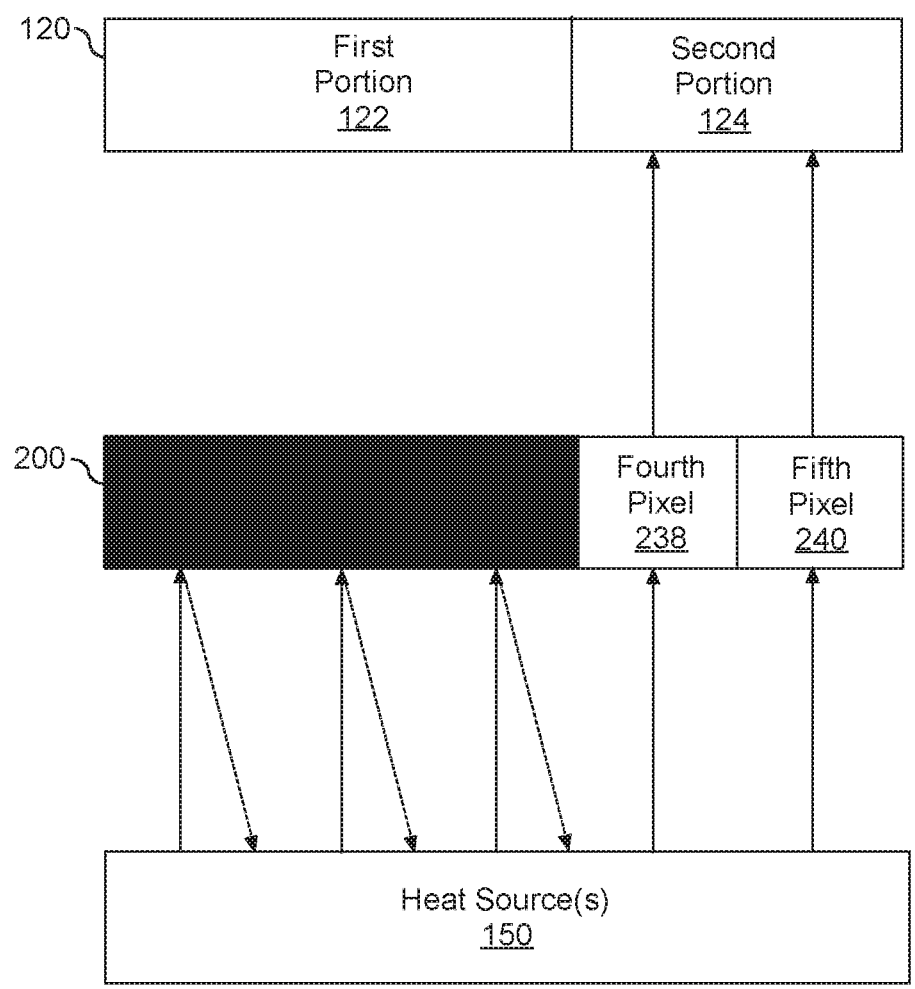
FIG. 4 depicts a first plurality of pixels of a tunable reflective array configured in an opaque state and a second plurality of pixels of the tunable reflective array configured in a translucent state according to example embodiments of the present disclosure.

Referring now to FIG. 4, the electrochromatic material of the first pixel 232, second pixel 234, and third pixel 236 of the tunable reflective array 200 can be configured in the opaque state. In this manner, the first pixel 232, second pixel 234 and third pixel 236 can reflect light emitted from the one or more heat sources 150. Conversely, the electrochromatic material of the fourth pixel 238 and fifth pixel 240 can remain in the translucent state. In this manner, light emitted from the one or more heat sources 150 can continue to at least partially pass through the fourth pixel 238 and the fifth pixel 240. As shown, light from the one or more heat sources 150 is now only emitted onto the second portion 124 of the workpiece 120. It should be appreciated that the electrochromatic material of one or more of the first pixel 232, second pixel 234 and third pixel 236 can remain in the opaque state until the temperature associated with the first portion 122 of the workpiece 120 is about equal to the temperature associated with the second portion 124 of the workpiece 120.

Figure 5:
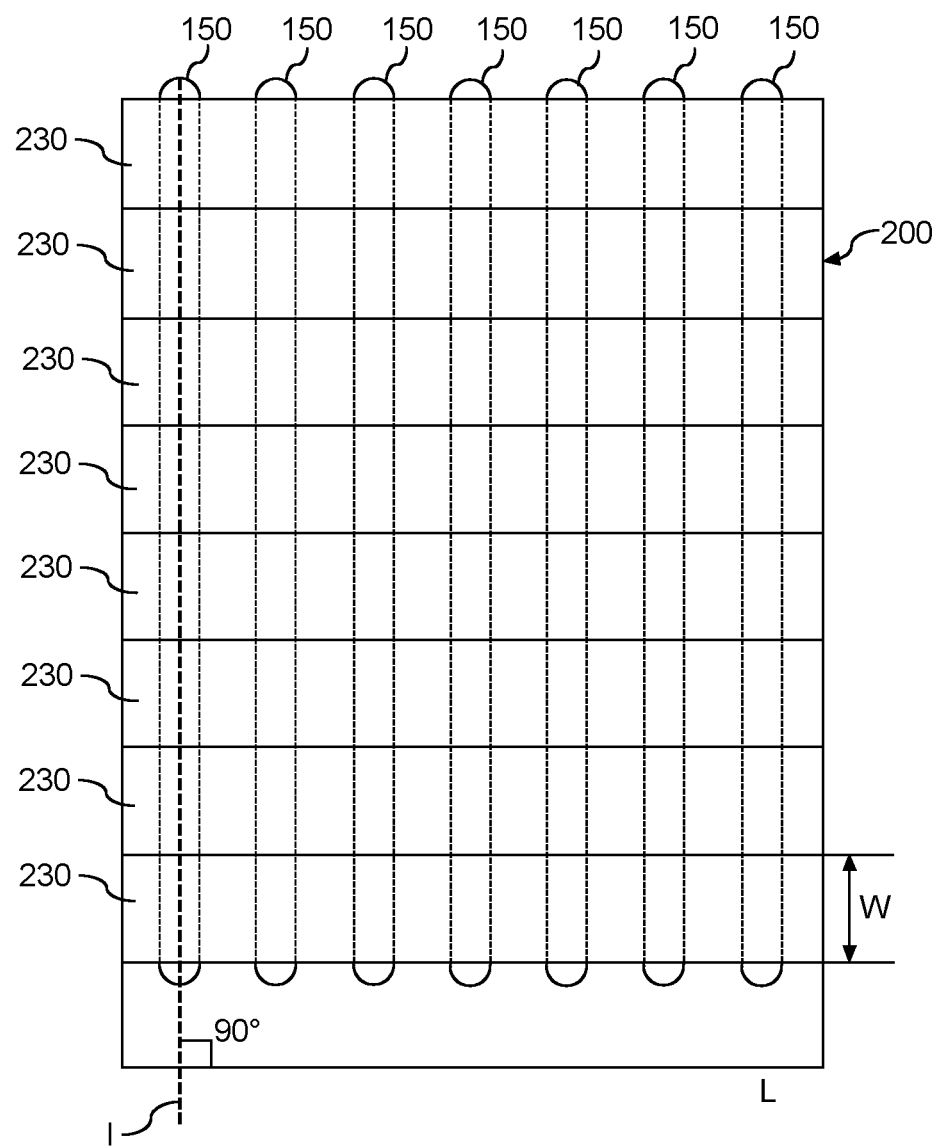
FIG. 5 depicts a tunable reflective array of a thermal processing system according to example embodiments of the present disclosure.

FIG. 5 depicts a plan view of an example tunable reflective array 200 disposed relative to a plurality of heat sources 150 (e.g., linear lamps). The plurality of heat sources 150 each have a long dimension l. The tunable reflective array 200 has a plurality of pixels, such as pixel 230. Each pixel (e.g., pixel 230) has a long dimension L that is larger than a short dimension W, such as about 5 times larger than the short dimension W. The pixels of the tunable reflective array 200 can be arranged such that the long dimension L is generally perpendicular to the long dimension l of each of the heat sources 150.

Figure 6:
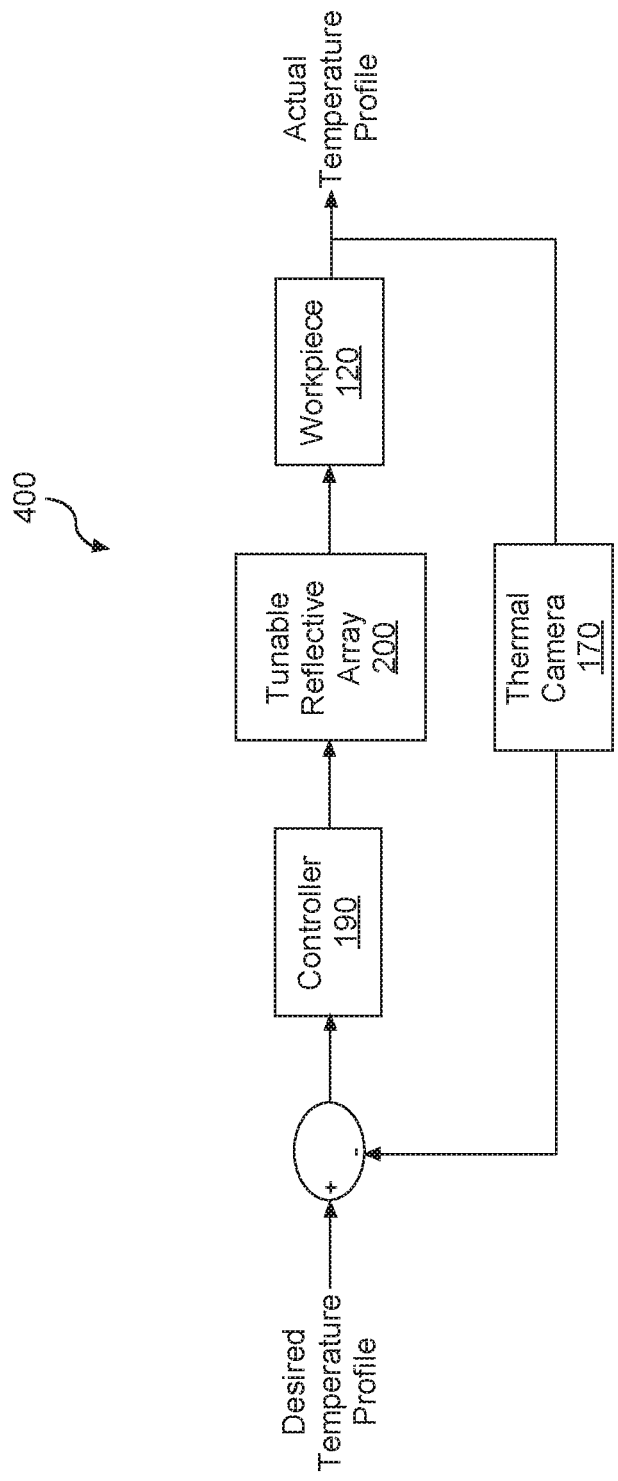
FIG. 6 depicts a closed-loop control system according to example embodiments of the present disclosure.

Referring now to FIG. 6, a block diagram of a closed-loop control system 400 is provided according to example embodiments of the present disclosure. As shown, the controller 190 can be configured to control operation of the tunable reflective array 200 such that the actual temperature profile of the workpiece 120 as measured by the thermal camera 170 corresponds to a desired temperature profile of the workpiece 120. Alternatively or additionally, the controller 190 can be configured to control operation of the tunable reflective array 200 such that the actual temperature profile of a surface of the workpiece as measured by the pyrometer 180 (FIG. 1) corresponds to a desired temperature profile of the surface. In some implementations, the desired temperature profile can correspond to a uniform temperature profile needed to reduce or eliminate thermal stresses on the workpiece 120 during a thermal treatment process, such a rapid thermal treatment. In this manner, anomalies (e.g., warpage) in the workpiece 120 that are attributable to non-uniformity in the temperature profile of the workpiece 120 during a thermal treatment process can be reduced or eliminated.

Figure 7:
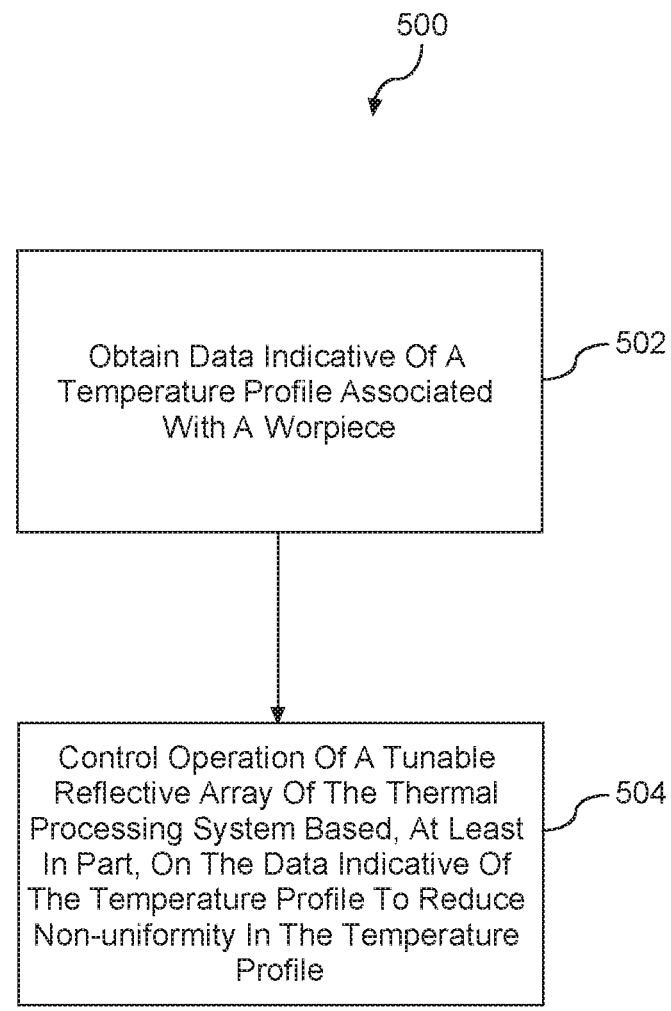
FIG. 7 depicts a flow diagram of a method for controlling operation of a thermal processing system according to example embodiments of the present disclosure.

Referring now to FIG. 7, a flow diagram of a method 500 for controlling operation of a rapid thermal processing system is provided according to example embodiments of the present disclosure. It should be appreciated that the method 500 can be implemented using the thermal processing system 100 discussed above with reference to FIG. 1. FIG. 6 depicts steps performed in a particular order for purposes of illustration and discussion. Those of ordinary skill in the art, using the disclosures provided herein, will understand that various steps of the method 500 may be adapted, modified, rearranged, performed simultaneously or modified in various ways without deviating from the scope of the present disclosure.

At (502), the method 500 can include obtaining, by a controller of a thermal processing system, data indicative of a temperature profile associated with a workpiece disposed within a processing chamber of a thermal processing system. In example embodiments, the data can be obtained from a thermal camera configured to obtain thermal image data (e.g., infrared image data) indicative of a temperature profile associated with the workpiece. Alternatively or additionally, the data can be obtained from a pyrometer configured to obtain data indicative of a temperature profile associated with a surface of the workpiece.

At (504), the method 500 can include controlling, by the controller, operation of a tunable reflective array of the thermal processing system based, at least in part, on the data obtained at (502) to reduce non-uniformity in the temperature profile associated with the workpiece.

In some implementations, the data obtained at (502) can indicate a first portion of the workpiece is warmer relative to a second portion of the workpiece. In such implementations, controlling operation of the reflective array at (504) can include configuring, by the controller, the electrochromatic material of one or more pixels of the tunable reflective array in an opaque state such that the one or more pixels reflect the light emitted from the one or more heat sources. In this manner, the amount of light emitted onto the first portion of the workpiece can be reduced.

In some implementations, the data obtained at (502) can indicate a first portion of the workpiece is colder relative to a second portion of the workpiece. In such implementations, controlling operation of the reflective array at (504) can include configuring, by the controller, one or more pixels of the reflective array in an opaque state such that light emitted from the heat source is not emitted onto the second portion of the workpiece.

Referring now to FIG. 8, a block diagram of components of the controller 190 is provided according to example embodiments of the present disclosure. As shown, the controller 190 can include one or more processors 192 configured to perform a variety of computer-implemented functions (e.g., performing the methods, steps, calculations and the like disclosed herein). As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits.

In some implementations, the controller 190 can include one or more memory devices 194. Examples of the memory device 194 can include computer-readable media including, but not limited to, non-transitory computer-readable media, such as RAM, ROM, hard drives, flash drives, or other suitable memory devices. The one or more memory devices 194 can store information accessible by the one or more processors 192, including computer-readable instructions that can be executed by the one or more processors 192. The computer-readable instructions can be any set of instructions that, when executed by the one or more processors 192, cause the one or more processors 192 to perform operations, such as controlling operation of the tunable reflective array 200 based, at least in part, on data indicative of a temperature profile associated with the workpiece 120 (FIG. 1). The computer-readable instructions can be software written in any suitable programming language or can be implemented in hardware.

In some implementations, the controller 190 can include a communications module 196 to facilitate communication between the controller 190 and various components of the thermal processing system 100 (FIG. 1). For instance, the controller 190 can send control signals to control operation of the tunable reflective array 200. Alternatively or additionally, the controller 190 can send control signals to control operation of the transmitter 182 of the device used to determine reflectivity of the workpiece 120 (FIG. 1).

Furthermore, the communications module 196 can include a sensor interface 198 to permit signals transmitted from one or more sensors of the thermal processing system 100 to be converted into signals that can be understood and processed by the controller 190. For example, the thermal camera 170, the pyrometer 180, and receiver 184 of the device used to determine reflectivity of the workpiece 120 (FIG. 1) can be coupled to the sensor interface 198 via a wired or wireless communications link. In this manner, the controller 190 can receive data associated with the one or more sensors.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing system, comprising:
   a processing chamber;
   a workpiece disposed within the processing chamber;
   a heat source configured to emit light towards the workpiece, the heat source including an array of linear lamps, each of the linear lamps having a long dimension that extends along a first direction; and
   a tunable reflective array disposed between the workpiece and the heat source, the tunable reflective array comprising a plurality of pixels, each of the plurality of pixels having a linear shape and a long dimension that extends along a second direction that is perpendicular to the first direction, each pixel of the plurality of pixels comprising an electrochromatic material configurable in a translucent state or an opaque state, wherein when the electrochromatic material is configured in the opaque state, the pixel reduces transmission of the light through the pixel, and wherein when the electrochromatic material is configured in the translucent state, light at least partially passes through the pixel.

2. The thermal processing system of claim 1, further comprising:

one or more sensors configured to obtain data indicative of a temperature profile associated with the workpiece.

3. The thermal processing system of claim 2, wherein the temperature profile is indicative of a spatial distribution of temperature across the workpiece.

4. The thermal processing system of claim 2, wherein the one or more sensors comprise a thermal camera, and wherein the data comprises thermal image data.

5. The thermal processing system of claim 2, wherein the one or more sensors comprise a pyrometer configured to obtain data indicative of the temperature profile associated with the workpiece.

6. The thermal processing system of claim 5, wherein the data obtained from the pyrometer comprises a plurality of temperature measurements, each temperature measurement associated with a different location on a surface of the workpiece.

7. The thermal processing system of claim 2, further comprising:

a controller configured to:

obtain the data indicative of the temperature profile associated with the workpiece; and control operation of the tunable reflective array based, at least in part, on the data to reduce non-uniformity in the temperature profile.

8. The thermal processing system of claim 7, wherein when the data indicates a first portion of the workpiece is warmer than a second portion of the workpiece, the controller is configured to control operation of the tunable reflective array to configure the electrochromatic material of one or more pixels of the tunable reflective array in the opaque state such that an amount of light emitted onto the first portion of the workpiece via the heat source is reduced.

9. The thermal processing system of claim 7 wherein when the data indicates a first portion of the workpiece is colder relative to a second portion of the workpiece, the controller is configured to control operation of the tunable reflective array to configure the electrochromatic material of one or more pixels of the tunable reflective array in the translucent state such that an amount of light emitted onto the first portion of the workpiece via the heat source is increased.

10. The thermal processing system of claim 1, further comprising:

a quartz window disposed between the tunable reflective array and the workpiece.

11. The thermal processing system of claim 10, wherein the processing chamber is defined, at least in part, by the quartz window.

12. The thermal processing system of claim 1, wherein the heat source comprises a plurality of heat lamps.

13. The thermal processing system of claim 1, wherein the heat source comprises a laser.

14. The thermal processing system of claim 1, further comprising:

a reflector configured to reflect the light towards the workpiece.

15. The thermal processing system of claim 1, wherein the workpiece comprises a semiconductor wafer.

* * * * *